(12) United States Patent
Ziari et al.

(10) Patent No.: US 6,404,542 B1
(45) Date of Patent: Jun. 11, 2002

(54) MULTIPLE EMITTER SEMICONDUCTOR LASER PUMP SOURCE FOR SCALING OF PUMP POWER AND GENERATION OF UNPOLARIZED LIGHT FOR LIGHT SIGNAL AMPLIFICATION

(75) Inventors: Mehrdad Ziari, Pleasanton; David F. Welch, Menlo Park; Vincent G. Dominic, Fremont; Bardia Pezeshki, San Jose; Robert J. Lang, Pleasanton, all of CA (US)

(73) Assignee: SDL, Inc., San Jose, CA (US)

( * ) Notice: Subject to any disclaimer, the term of this patent is extended or adjusted under 35 U.S.C. 154(b) by 141 days.

(21) Appl. No.: 09/613,519

(22) Filed: Jul. 10, 2000

(51) Int. Cl.⁷ .................................................. H01S 3/00
(52) U.S. Cl. ................................ 359/341.3; 359/341.33
(58) Field of Search ......................... 359/341.3, 341.33; 372/6

(56) References Cited

U.S. PATENT DOCUMENTS 5,608,742 A * 3/1997 Peterson ........................ 372/6
6,081,369 A * 6/2000 Waarts et al. ................ 359/341
6,320,695 B1 * 11/2001 Tanaka et al. ............ 359/341.33

OTHER PUBLICATIONS

Takahashi, Hiroshi, et al., "Polarization–Insensitive Arrayed–Waveguide Grating Wavelength Multiplexer On Silicon", Optics Letter, vol. 17, No. 7, Apr. 1, 1992, pp. 499–501.

* cited by examiner

Primary Examiner—Mark Hellner
(74) Attorney, Agent, or Firm—Kudirka & Jobse, LLP

(57) ABSTRACT

A pump source for rare earth and Raman amplifiers or for distributed amplification uses two or more light sources to generate two source beams that are combined by a beam combiner to form the output pump beam. In accordance with one embodiment, the light sources are a diode laser array having be two or more monolithic laser stripes providing dual output beams having substantially the same polarization, such as the TE mode. One of the polarized due outputs is rotated 90° and both beams are applied to a birefringent crystal that combines the beams for insertion into an optical fiber or into a rare earth doped fiber or into a fiber capable of Raman amplification via SRS. The power output of each polarization in the combined beam can be measured and used to drive a feedback circuit that controls the current provided to each diode in order to maintain the power in the two polarization components of the output beam equal.

32 Claims, 3 Drawing Sheets

MULTIPLE EMITTER SEMICONDUCTOR LASER PUMP SOURCE FOR SCALING OF PUMP POWER AND GENERATION OF UNPOLARIZED LIGHT FOR LIGHT SIGNAL AMPLIFICATION

FIELD OF THE INVENTION

This invention relates generally to optical gain devices and, more specifically, to pump sources providing for unpolarized pump light for use in optical signal amplification in optical gain devices such as rare earth fiber amplifiers and Raman amplifiers or Raman distributed amplification in fibers using stimulated Raman scattering.

BACKGROUND OF THE INVENTION

An optical gain medium is a device that, when provided with optical pumping energy, increases the amplitude of a desired optical signal propagating through such a device. Optical gain media may be constructed using optical fiber, such as that used for fiber lasers or fiber-based optical amplifiers or it may be a planar waveguide device having an embedded waveguide structure doped with a rare earth dopant. Forms of optical amplifiers known in the art are rare earth amplifiers, such as those formed from erbium or erbium doped fiber amplifiers (EDFA's) and Raman amplifiers utilizing stimulated Raman scattering (SRS). In either case, optical pumping energy is injected into an optical fiber medium through which the signal to be amplified is propagating. The optical pumping energy, via either induced higher ion energy level or SRS, allows for a transfer of optical power to a wavelength longer than the pumping wavelength, due to the excitation of a vibrational mode in the medium that provides gain at the longer wavelength. A fiber laser is similar in functioning except that there is no signal to be amplified. In such a laser, erbium induced gain or Raman gain is developed between reflectors (which may be Bragg gratings in the case of glass fibers) provides a higher wavelength signal or a Stokes-shifted output signal of longer wavelength. A Raman laser or amplifier is a useful device for providing amplification at a target wavelength while pumped at a shorter wavelength. These types of amplifiers are particularly suitable for use in signal amplification in optical telecommunication systems.

It is desirable for pump sources for telecommunication applications to have the capability of power scaling and/or provide a depolarized output. In the case of an EDFA, multiple pump sources can be combined to provide an increase in pump power for purposes of enhanced signal amplification. In the case of Raman amplifiers multiple pump sources can provide both power scaling and also depolarized light output so that the signal to be amplified is capable of receiving continuous amplification energy in spite of changes in signal polarization as the signal propagates along the fiber medium.

While multiple pump sources, such as laser diode sources, are possible and have been combined in a convenient small package and employed as amplifier pump sources, they are not well suited as pump sources since laser diodes have polarized outputs and typically comprise a plurality of separate laser diodes which are bulky and are labor intensive to provide for combined laser diode light output.

SUMMARY OF THE INVENTION

A pump source constructed in accordance with the principles of the invention uses a dual stripe diode that generates two light beams with the same inherent polarization. A half wave plate rotates one beam so that it is polarized orthogonal to the other beam. Both beams are then applied to a polarization combiner that combines the beams to form an unpolarized beam that is focused to a single spot. The focused unpolarized output beam is utilized for pumping an optical amplifier, such as, for example, a planar waveguide amplifier, a rare earth fiber amplifier, a Raman fiber amplifier or for Raman distributed amplification.

In one embodiment, a birefringent crystal is used as the polarization combiner. The combined beams are then applied to a fiber via a lens, such as a graded index (GRIN) lens, used as a collimator. This arrangement can be integrated into a conventional housing, such as a "butterfly" module or package, employing a cylindrical housing for the birefringent crystal and the GRIN lens fiber collimator.

In accordance with another embodiment, a dual stripe diode generates two beams with the same polarization. The beams are focussed on an optical device having two waveguides so that each beam enters one waveguide. A half wave plate introduced into one waveguide rotates one beam so that it is polarized orthogonal to the other beam. The waveguides are then fashioned into a conventional coupler or a Mach-Zehnder structure that combines the orthogonally polarized beams to provide an output comprising a single unpolarized beam.

In still another embodiment, a dual stripe diode generates two beams with the same polarization. Each beam is introduced into a polarization-maintaining (PM) fiber. One of the fibers is rotated 90° so that, at the fiber beam output, the respective beam polarizations are orthogonal. The two polarization maintaining fibers are then fused to a fiber coupler, for example, a fiber Mach-Zehnder structure, that combines the orthogonally polarized beams to provide an output comprising a single unpolarized beam.

In accordance with still another embodiment, the power output of each polarization in the combined beam is measured and used to drive a feedback circuit that controls the current provided to each diode stripe in order to keep the power in the two polarization components substantially equal.

BRIEF DESCRIPTION OF THE DRAWINGS

The above and further advantages of the invention may be better understood by referring to the following description in conjunction with the accompanying drawings in which.

DETAILED DESCRIPTION

Figure 1:
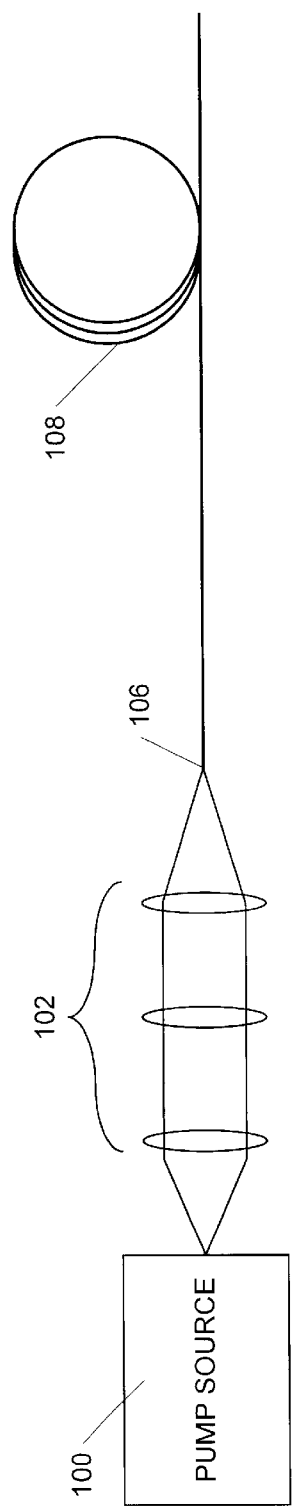
FIG. 1 is a schematic diagram of a Raman gain device driven by a conventional pump source

FIG. 1 is a schematic diagram illustrating the components of a conventional amplifier system in this case employing stimulated Raman scattering. The system uses a pump source 100 is typically an unpolarized light source with output power of at least hundreds of milliwatts with a bandwidth of about 2 nm with stable spectral density. The output of source 100 is passed through a conventional optical system schematically shown as lenses 102 that are well known in the art. This optical system may have lenses for collimating the light from source 100, for cylindrical optical correction, and for focussing and coupling the light onto the end 106 of fiber 108.

Figure 2:
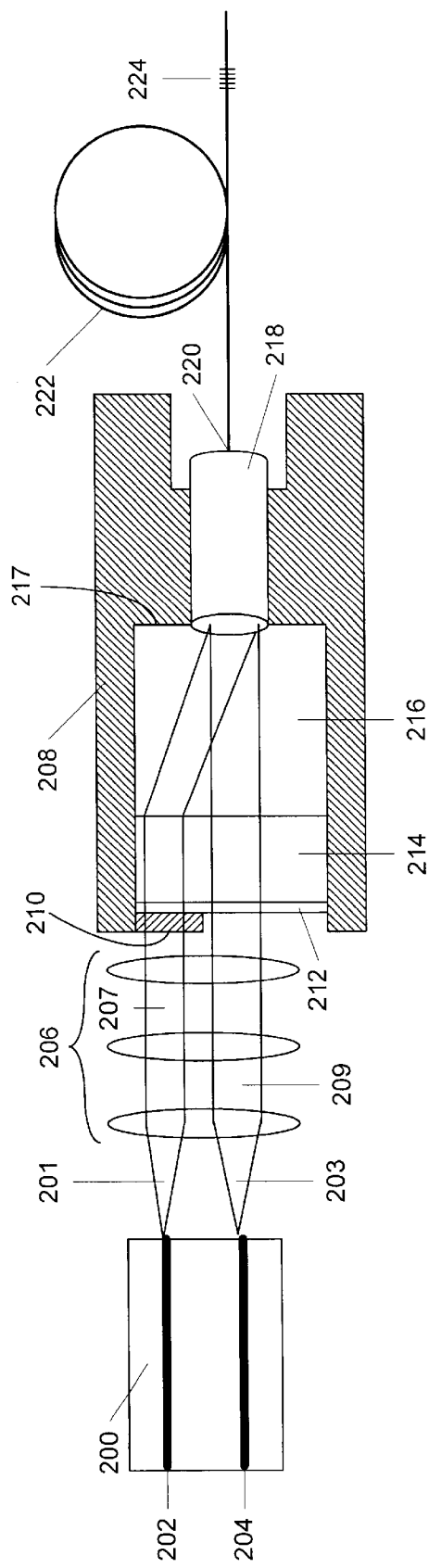
FIG. 2 is a schematic diagram of a first embodiment of the invention using an ntegrated diode and crystal design to combine two pump diodes into a single fiber in ccordance with principles of the invention.

An embodiment constructed in accordance with the principles of the invention is shown in FIG. 2. In this embodiment, a fiber coupled packaged pump laser source comprises the two pump beams are generated by a monolithic dual waveguide laser diode 200 having two laser stripe emitters separated, for example, by 50 $\mu$m or more. The dual stripe lasers 202 and 204 are driven in parallel to provide excitation simultaneously to produce dual output beams. The two pumped waveguide lasers 202 and 204 provide output beams 207 and 209 that have the same polarization due to the geometry and structure of the chip 200. The parallel light beams 201 and 203 from waveguides 202 and 204 are passed through a lens system shown schematically as lenses 206 which may by used for cylindrical correction collimation and magnification in a conventional fashion. These beams may then enter housing 208 through a transparent faceplate 212 that is optional.

One beam 209 passes directly into housing 208 through faceplate 212 and the other beam 207 passes through half wave plate 210 which is attached to faceplate 212, such a with an epoxy, cement or other commonly used adhesive employed in the securing together of optical components. Half wave plate 210 is a conventional optical device that rotates the polarization of beam 207 by 90° so that its polarization is orthogonal to beam 209. Half wave plate 210 may be constructed of quartz or calcite or other suitable materials such as polyimide (15 $\mu$m). Alternatively, the plate may be constructed in a known manner by applying a polymer coating on a surface and then exposing the polymer coating to linearly-polarized ultraviolet light. Such structures are described in detail in an article entitled "Large Photoinduced Birefringence in an Optically Nonlinear Polyester Polymer", Y. Shi and W. Steier, L. Yu, M. Chen and L. Dalton, *Applied Physics Letters*, v. 59, n. 23, Dec. 2, 1991, which article is hereby incorporated by reference in its entirety.

Housing 208 contains a polarization combiner in the form of a birefringent, or walk-off, crystal 216. Birefringent crystals are well-known transparent materials in which the refractive index varies as a function of polarization of an incident ray as well as the orientation of the crystal with respect to the incident ray. Birefringent materials, including crystals, have the ability to refract an incident beam into two separate, orthogonally polarized beams, which, in the general case, take different paths through the crystal, depending on orientation of the material with respect to the incident beam. The refracted beam rays are referred to as the "ordinary," or "o" ray, and the "extraordinary," or "e" ray. In this application, the orthogonally polarized incoming pump beams 307 and 209 correspond to the ordinary and extraordinary rays. If the face angle 214 of crystal 216 is chosen correctly, the light beams 207 and 209 are combined into a single beam that emerges from the crystal 216 at the crystal rear face 217. The housing 208 also contains a focussing lens such as, for example, a graded index (GRIN) lens 218 that couples the combined beam at the crystal rear face 217 to the end 220 of fiber 222. Other types of focussing lenses may be employed instead of GRIN lens 218.

Housing 208 and its contents may be cylindrical so that the entire system may be housed in a conventional housing such as a "butterfly" package for convenience or be housed in the extended snot of a rectangular butterfly package in a manner similar to isolated laser diode modules where the collimating lens and the optical isolator are not part of the package. In this configuration, the housing, birefringent crystal and GRIN lens have a similar configuration to a section of a commercially available polarization-insensitive optical isolator.

The advantage of the pump source of FIG. 2 is the employment of a single chip with multiple beam outputs to provide not only energy scaling for enhanced fiber amplifier gain, but also unpolarized light, i.e., circularly polarized light, which is suitable for Raman amplifier signal amplification. Moreover, a single chip with multiple emitters and output beams provides for essentially the same production yield as a single laser chip. As a result, the manufacturing cost of a PM combined pump source using a dual stripe laser chip is nearly the same as that of a standard single emitter pump, but the combined pump source provides twice the output power from a single optical train. The packaged structure is also compatible with inline isolators.

Also, in this embodiment as well as subsequent embodiments, a single reflector, such as, for example, a fiber Bragg grating may be employed to stabilize both waveguide lasers 202 and 204 to a single wavelength. A grating 224 may be provided in the fiber 222 in a conventional fashion to provide feedback to the laser diode 200. The feedback forces the diode 200 to operate at a peak wavelength within the bandwidth of the grating 224 and stabilizes the wavelengths produced from both waveguide stripe lasers 202 and 204. Such stabilization is known in the art as seen in U.S. Pat. Nos 5,485,481; 5,715,263; and 6,044,093 which are incorporated herein by their reference.

Figure 3:
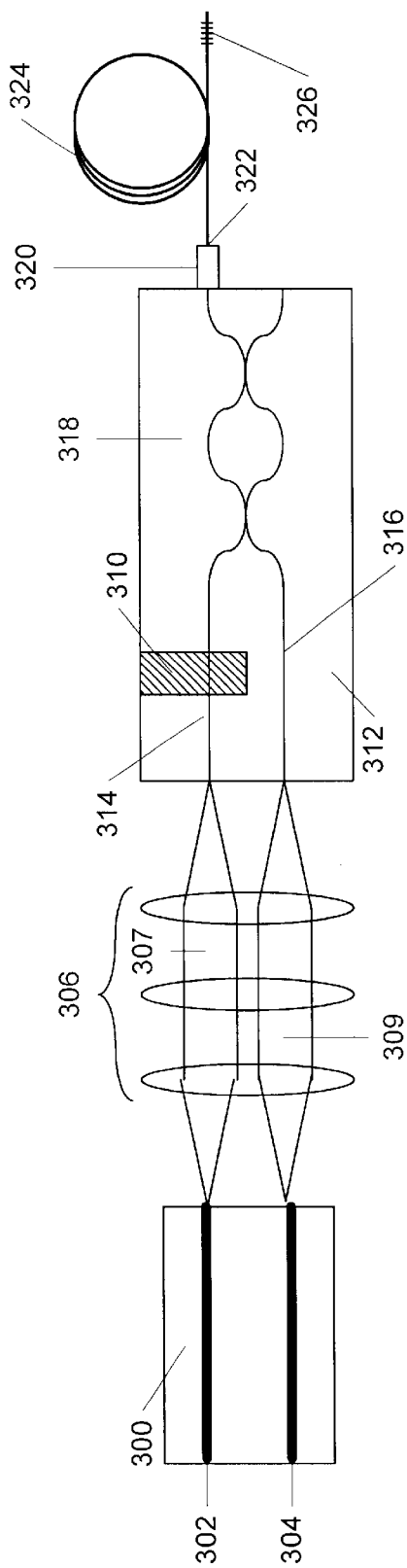
FIG. 3 is a schematic diagram of another embodiment using a dual diode and a waveguide to combine two pump diodes into a single fiber in accordance with the principles of the invention.

FIG. 3 shows an alternative embodiment in which a waveguide coupler is used to combine the two pump beams. A dual waveguide diode 300 generates two output beams 307 and 309 from waveguide laser emitters 302 and 304 in which the polarization of the two beams 307, 309 is inherently the same. As shown schematically in FIG. 3, the beams pass through lenses 306, which collimate and focus the beams onto waveguide structure 312. Alternatively, in lieu of lens arrangement 306, laser diode 300 may be integrated with a mode expander to provide low-loss butt-joint coupling to the waveguide coupler. Waveguide structure 312 may be constructed from glass, polymer, or semiconductor material in a conventional manner by fabrication processes well known in the art. Structure 312 comprises two waveguides 314 and 316 in which the polarization of the input light beam is maintained. A half waveplate 310, such as previously discussed above, is inserted into one waveguide 314 in order to rotate the polarization of one pump beam 90° to the other pump beam. After the polarization of the polarization in waveguide 314 has been rotated 90°, the two waveguides are formed into a conventional waveguide coupler, such as, for example, a Mach-Zehnder structure schematically shown at 318. This structure is a well-known device that combines the two beams such that all optical power exits in one waveguide. This power may be coupled, for example by conventional coupling optics 320 into the fiber input end 322 of fiber 324 as previously indicated.

As in the case of the embodiment in FIG. 2, the dual lasers 302 and 304 of the dual waveguide laser diode 300 may optionally include fiber Bragg grating 326 at its output to stabilize both lasers 302 and 304 to a single wavelength.

Figure 4:
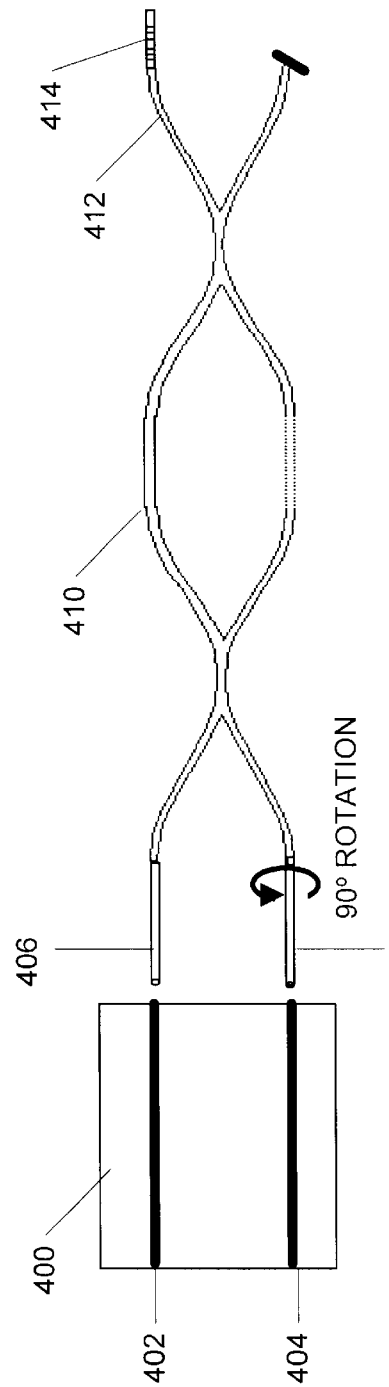
FIG. 4 is a schematic diagram of another embodiment using a dual diode and a pair of polarization maintaining fibers to combine two pump diodes into a single fiber in accordance with the principles of the invention.

Another embodiment is illustrated in FIG. 4. A dual waveguide diode 400 generates two output beams from waveguides 402 and 404 in which the polarization of the two output beams is the same. As shown schematically in FIG. 4, the two output beams are applied to two polarization-maintaining (PM) fibers 406 and 408, with one beam being applied to each fiber. One of the fibers is then physically rotated in order to rotate the polarization of one pump beam 900 relative to the other pump beam. The two fibers are then fused together at selected locations in order to form a conventional coupler or a Mach-Zehnder structure 410. As described in connection with FIG. 3, this structure combines the two beams such that all optical power exits in one fiber, such as at 412. This power may be coupled into the input end of an EDFA (not shown) or coupled into a fiber (not shown) used as a Raman amplifier or for Raman distributed amplification, as previously indicated. This embodiment has the advantage that the pump output has a low degree of polarization and the manufacturing cost should be nearly the same as the manufacturing cost of a standard pump laser used in fiber amplifier applications. Further, the arrangement is compatible with in-line optical isolators and a single grating 414 can be used, as discussed above in connection with FIG. 2, to stabilize both diode waveguides to a single wavelength.

One drawback of this embodiment is the maintenance of the birefringence of the PM fibers when constructing such a Mach-Zehnder structure 410. However, with careful manufacturing during fiber fusing of the coupler regions, the birefringence can be substantially maintained.

Also, an unbalanced Mach-Zehnder structure may be utilized to control the phase difference between the light propagating in the legs of the Mach-Zehnder in order to provide a narrower bandwidth of output wavelengths. This may be employed advantageously in an EDFA amplification configuration to provide for a wavelength bandwidth within the absorption bandwidth of the amplifier. However, it is generally desired that the Mach-Zehnder legs be balanced to provide for maximum output at one output with a broad bandwidth particularly in the case for Raman amplification.

Figure 5:
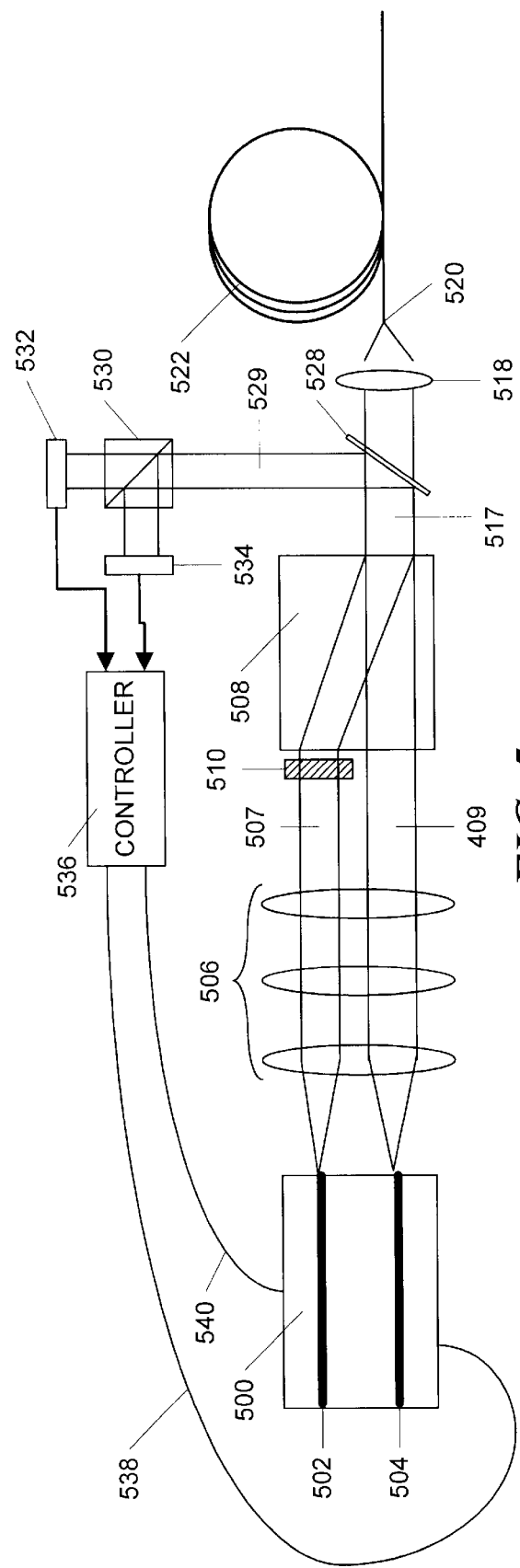
FIG. 5 is a further embodiment of an illustrative feedback arrangement for controlling the two pump sources to maintain the power output of one source equal to the power output of the other source.

FIG. 5 illustrates yet another embodiment in which feedback is used to control the dual pump source diodes in order to insure that the powers of the two output beams are maintained substantially equal. In the embodiment shown in FIG. 5, some elements correspond to those shown in FIGS. 2, 3 and 4 and have corresponding numeral designations so that the description in those embodiments applies equally here. For example, lenses 506 in FIG. 5 correspond to lenses 206 in FIG. 2. A dual waveguide diode 500 generates two output beams 507 and 509 from waveguides 502 and 504 in which the polarization of the two beams 507, 509 is the same. As shown schematically in FIG. 5, the beams pass through lenses 506, half wave plate 510 and crystal 508 in the same manner as shown in FIG. 2. However, instead of the combined beam 517 being coupled directly into the end 520 of fiber 522, a beamsplitter 528 is interposed between the coupling optics, shown schematically as 518, and the birefringence crystal 508.

The beam splitter 528 reflects a fraction 529 of the combined beam 517 to a polarization beamsplifter 530. Beamsplitter 530 is a well-known device that divides an incoming optical beam into two orthogonally polarized components. These two components are incident on optical detectors 532 and 534, respectively. Detectors 532 and 534 are also well known optical components that generate an output signal proportional to the optical power that is incident on them. The signals generated by the two detectors are applied to a control circuit 536. The control circuit 536, in turn, generates currents that are applied via leads 538 and 540 to drive the diodes 502 and 504. Controller 536 sets the ratio between the two drive currents in order to minimize the difference in the optical output power between the two diodes 502 and 504.

The dual wavelength laser diode source with a dual output that is combined to form a depolarized output comprising this invention may be used in applications and optical arrangements set forth in U.S. patent application Ser. No. 09/559,936, filed Apr. 27, 2000 and entitled, "DEPOLARIZED SEMICONDUCTOR LASER SOURCES", which is owned by the assignee herein and is incorporated in full herein by its reference. Also, this invention my be employed co-propagating and counter-propagating source applications as set forth in U.S. Provisional patent Application Sererial No. 60/171,889, filed Dec. 23,1999 and entitled, "AN IMPROVED LOSSLESS OPTICAL TRANSMISSION LINK", which is owned by the assignee herein and is incorporated in full herein by its reference. Lastly, the laser stripe geometry of the dual wavelength laser diode source may include a flared gain section as taught in U.S. patent application Ser. No. 09/375,687, filed Aug. 17, 1999 and entitled, "GRATING STABILIZED FLARED SEMICONDUCTOR AMPLIFIER SOURCES PROVIDING DIFFRACTION LIMITED FIBER COUPLED PUMP POWER", which is owned by the assignee herein and is incorporated in full herein by its reference.

Although exemplary embodiments of the invention have been disclosed, it will be apparent to those skilled in the art that various changes and modifications can be made which will achieve some of the advantages of the invention without departing from the spirit and scope of the invention. For example, it will be obvious to those reasonably skilled in the art that, in some implementations, the two pump sources could be generated by two separate laser diodes having the same polarization output. Further, it is possible that the output beams several emitter sources from a single laser array or from discrete laser diodes having different wavelengths can be initially wavelength-combined into two groups providing dual outputs of the same polarization and one output is rotated 90° with respect to the other and applied in the manner as taught in the embodiments of this application to produce a comparatively higher output power, unpolarized source. Other aspects, such as the specific materials utilized to manufacture a particular element, as well as other modifications to the inventive concept are intended to be covered by the appended claims.

What is claimed is:

1. A light source which generates a single unpolarized output beam for application to an optical fiber, the source comprising:

a single laser diode having two waveguides which generate a first and second light beams with a predetermined wavelength and the same polarization;

a polarization rotator which rotates the polarization of the first light beam so that the polarization of the rotated beam is orthogonal to the polarization of the second light beam; and a polarization combiner which combines the rotated first light beam with the second light beam to form the output beam.

2. A light source as recited in claim 1 wherein the polarization combiner is a birefringent crystal.

3. A light source as recited in claim 1 further comprising at least one collimating lens located between the plurality of light sources and the polarization combiner.

4. A light source as recited in claim 1 further comprising coupling optics for coupling the output beam into an optical fiber.

5. A light source as recited in claim 4 wherein the coupling optics comprise a graded index lens.

6. A light source as recited in claim 5 wherein the polarization combiner comprises a birefringent crystal and the birefringent crystal and the coupling optics are enclosed in a single housing.

7. A light source as recited in claim 6 wherein the housing and the plurality of light sources are enclosed in a conventional butterfly case.

8. A light source as recited in claim 1 wherein the polarization combiner is an integrated polarization waveguide coupler.

9. A light source as recited in claim 1 wherein the polarization combiner is a MachZehnder structure.

10. A light source as recited in claim 1 wherein the polarization combiner comprises two polarization-maintaining fibers.

11. A light source as recited in claim 10 wherein one of the polarization-maintaining fibers is physically rotated 90° with respect to the other polarization-maintaining fiber so that the first and second source light beam are orthogonally polarized.

12. A light source as recited in claim 1 further comprising a stabilization grating coupled to receive the output and reflect back a portion of the light to stabilize the wavelength operation of both emitters.

13. A light source as recited in claim 1 further comprising an optical amplifier coupled to receive the output beam and the first and second light beams have a wavelength band within the absorption band of the optical amplifier.

14. A light source as recited in claim 13 wherein the optical amplifier comprises a planar waveguide amplifier, a rare earth fiber amplifier, a Raman fiber amplifier or Raman distributed amplification.

15. A light source which generates a single unpolarized output beam for application to an optical fiber, the source comprising:
    a single laser diode having two waveguides which generate the first source light beam and the second source light beam, the polarization of a first source light beam being the same as the polarization of a second source light beam; and
    a half wave plate which rotates the polarization of the first light beam so that the polarization of the rotated beam is orthogonal to the polarization of the second light beam; and
    a birefringent crystal which combines the rotated first light beam with the second light beam to form the output beam.

16. A light source as recited in claim 15 further comprising at least one collimating lens located between the laser diode and the half wave plate.

17. A light source as recited in claim 15 further comprising coupling optics for coupling the output beam into an optical fiber.

18. A light source as recited in claim 17 wherein the coupling optics comprise a graded index lens.

19. A light source as recited in claim 15 wherein the half wave plate, the birefringent crystal and the coupling optics are enclosed in a single housing.

20. A light source as recited in claim 19 wherein the housing and the plurality of light sources are enclosed in a butterfly case.

21. A light source as recited in claim 15 wherein the two waveguides develop power in the first and second source light beams which power is controlled by a current applied to each waveguide and wherein the light source further comprises a feedback system that is responsive to the power in the first and second source light beams for controlling the current applied to each waveguide to make the power in the first and second source light beams equal.

22. A light source as recited in claim 21 wherein the feedback system is responsive to the output beam for controlling the current applied to each waveguide.

23. A light source as recited in claim 21 wherein the feedback system comprises a polarization beam splitter which responds to the output beam by separating the output beam into two orthogonally polarized beams and two detectors for detecting the power in the two orthogonally polarized beams and generating signals representative thereof.

24. A light source as recited in claim 23 wherein the feedback system further comprises a controller which is responsive to the signals generated by the two detectors for controlling the currents applied to the waveguides.

25. A light source as recited in claim 15 wherein the temperature of the single laser diode is temperature controlled to control the wavelength of operation of the two waveguides.

26. A light source for providing enhanced optical power for pumping an optical amplifier comprising:
    a laser diode source having multiple emitters generating at least two light output beams having inherently the same polarization;
    a polarization rotator which rotates the polarization of one light output beam relative to the other light output beam;
    a polarization combiner for combining the rotated light output beam with the other light output beam to form a single substantially unpolarized output beam; and
    an optical amplifier coupled to receive the single unpolarized output beam for pumping the same.

27. A light source as recited in claim 26 wherein the optical amplifier comprises a planar waveguide amplifier, a rare earth fiber amplifier, a Raman fiber amplifier or Raman distributed amplification.

28. A light source as recited in claim 26 further comprising a feedback circuit that receives a portion of the single substantially unpolarized output beam and provides a signal representative of the difference in optical power between orthogonal polarization modes in the single substantially unpolarized output beam and a controller to generating a plurality of control signals, one for driving each of said emitters so that any difference in the optical output power between the emitters is minimized.

29. A light source as recited in claim 26 wherein there are at least two emitters.

30. A light source as recited in claim 26 further comprising a reflector positioned between the polarization combiner and the optical amplifier to reflect a fraction of the light back into each of the emitters to stabilize their operational wavelength.

31. A light source as recited in claim 30 wherein the reflector comprises a grating.

32. A light source as recited in claim 31 wherein the grating comprises a fiber Bragg grating.

* * * * *